United States Patent
Chann et al.

(10) Patent No.: US 9,575,325 B2
(45) Date of Patent: *Feb. 21, 2017

(54) TWO-DIMENSIONAL WAVELENGTH-BEAM-COMBINING OF LASERS USING FIRST-ORDER GRATING STACK

(71) Applicant: MASSACHUSETTS INSTITUTE OF TECHNOLOGY, Cambridge, MA (US)

(72) Inventors: Bien Chann, Merrimack, NH (US); Tso Yee Fan, Belmont, MA (US); Antonio Sanchez-Rubio, Lexington, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 381 days.

This patent is subject to a terminal disclaimer.

(21) Appl. No.: 14/136,601

(22) Filed: Dec. 20, 2013

(65) Prior Publication Data

US 2014/0192417 A1 Jul. 10, 2014

Related U.S. Application Data

(63) Continuation of application No. 12/720,186, filed on Mar. 9, 2010, now Pat. No. 8,614,853.

(51) Int. Cl.
*G02B 27/10* (2006.01)
*G02B 27/09* (2006.01)
(Continued)

(52) U.S. Cl.
CPC ......... *G02B 27/1006* (2013.01); *G02B 5/1819* (2013.01); *G02B 19/0014* (2013.01);
(Continued)

(58) Field of Classification Search
USPC ... 359/19, 20, 618, 619, 620, 621, 622, 623, 359/626, 640, 563, 566
See application file for complete search history.

(56) References Cited

U.S. PATENT DOCUMENTS

| | | |
|---|---|---|
| 4,467,468 A | 8/1984 | Miller |
| 4,817,207 A | 3/1989 | Smith et al. |
| | (Continued) | |

FOREIGN PATENT DOCUMENTS

| | | |
|---|---|---|
| DE | 19811032 A1 | 10/1998 |
| EP | 0938197 A2 | 8/1999 |
| | (Continued) | |

OTHER PUBLICATIONS

August, Steven J. et al., "Beam Combining of Ytterbium Fiber Amplifiers (Invited)," Journal of Optical Social America B., vol. 24, No. 8, Aug. 2007.
(Continued)

*Primary Examiner* — Joseph P Martinez
*Assistant Examiner* — Brandi Thomas
(74) *Attorney, Agent, or Firm* — Lando & Anastasi, LLP

(57) ABSTRACT

A method and apparatus for two-dimensional wavelength beam combining of laser sources. In one example, an external cavity multi-wavelength laser includes an array of laser emitters each producing an optical beam having a specified wavelength, a grating stack comprising a plurality of first-order diffraction gratings arranged linearly in a first dimension, and a dispersive element. The laser further includes a cylindrical telescope that images the optical beams from the array of laser emitters onto the grating stack. A first cylindrical transform lens spatially overlaps the optical beams in a second dimension forming a first region of overlap at the grating stack. A second cylindrical transform lens spatially overlaps the optical beams from the
(Continued)

grating stack in the first dimension forming a second region of overlap at the dispersive element. The dispersive element transmits a multi-wavelength output beam comprising the spatially overlapped optical beams from the array of laser emitters.

10 Claims, 8 Drawing Sheets

(51) Int. Cl.
*H01S 5/40* (2006.01)
*G02B 19/00* (2006.01)
*G02B 5/18* (2006.01)

(52) U.S. Cl.
CPC ..... *G02B 19/0057* (2013.01); *G02B 27/0944* (2013.01); *G02B 27/0966* (2013.01); *G02B 27/1093* (2013.01); *H01S 5/4012* (2013.01); *H01S 5/4025* (2013.01); *H01S 5/4087* (2013.01)

(56) References Cited

U.S. PATENT DOCUMENTS

| | | | |
|---|---|---|---|
| 4,961,195 | A | 10/1990 | Skupsky et al. |
| 5,005,166 | A | 4/1991 | Suzuki et al. |
| 5,009,658 | A | 4/1991 | Damgaard-Iversen et al. |
| 5,010,543 | A | 4/1991 | Hill |
| 5,076,672 | A | 12/1991 | Tsuda et al. |
| 5,095,478 | A | 3/1992 | Taki et al. |
| 5,095,487 | A | 3/1992 | Meyerhofer et al. |
| 5,319,484 | A | 6/1994 | Jacob et al. |
| 5,325,222 | A | 6/1994 | Jacob et al. |
| 5,329,396 | A | 7/1994 | Fishman et al. |
| 5,404,240 | A | 4/1995 | Nishio et al. |
| 5,589,967 | A | 12/1996 | Auffret |
| 5,631,758 | A | 5/1997 | Knox et al. |
| 5,694,408 | A | 12/1997 | Bott et al. |
| 5,861,965 | A | 1/1999 | Koren et al. |
| 5,892,607 | A | 4/1999 | Atlas |
| 6,061,369 | A | 5/2000 | Conradi |
| 6,100,831 | A | 8/2000 | Frankel |
| 6,167,075 | A | 12/2000 | Craig et al. |
| 6,192,062 | B1 | 2/2001 | Sanchez-Rubio et al. |
| 6,212,310 | B1 | 4/2001 | Waarts et al. |
| 6,252,693 | B1 | 6/2001 | Blauvelt |
| 6,275,632 | B1 | 8/2001 | Waarts et al. |
| 6,307,668 | B1 | 10/2001 | Bastien et al. |
| 6,327,068 | B1 | 12/2001 | Silberberg et al. |
| 6,327,292 | B1 | 12/2001 | Sanchez-Rubio et al. |
| 6,330,388 | B1 | 12/2001 | Bendett et al. |
| 6,356,576 | B1 | 3/2002 | Smith |
| 6,381,048 | B1 | 4/2002 | Chraplyvy et al. |
| 6,400,871 | B1 | 6/2002 | Minden |
| 6,434,175 | B1 | 8/2002 | Zah |
| 6,570,704 | B2 | 5/2003 | Palese |
| RE38,289 | E | 10/2003 | Bergano |
| 6,678,294 | B1 | 1/2004 | Komine et al. |
| 6,763,054 | B2 | 7/2004 | Whitley |
| 6,775,478 | B2 | 8/2004 | Suzuki et al. |
| 7,020,168 | B2 | 3/2006 | Bernasconi et al. |
| 7,110,168 | B2 | 9/2006 | Lee et al. |
| 7,199,924 | B1 | 4/2007 | Brown et al. |
| 7,239,777 | B1 | 7/2007 | Christensen et al. |
| 7,271,949 | B2 | 9/2007 | Kim et al. |
| 7,272,319 | B1 | 9/2007 | Piccirilli et al. |
| 7,298,711 | B1 | 11/2007 | Jarcy |
| 7,298,771 | B2 | 11/2007 | Volodin et al. |
| 7,339,727 | B1 | 3/2008 | Rothenberg et al. |
| 7,340,172 | B2 | 3/2008 | Giles et al. |
| 7,346,085 | B1 | 3/2008 | Rothenberg et al. |
| 7,376,349 | B2 | 5/2008 | Ionov et al. |
| 7,436,588 | B2 | 10/2008 | Rothenberg et al. |
| 7,440,174 | B2 | 10/2008 | Rice et al. |
| 7,468,832 | B2 | 12/2008 | Rothenberg et al. |
| 7,574,139 | B2 | 8/2009 | Fu et al. |
| 7,620,324 | B2 | 11/2009 | Minato et al. |
| 7,653,096 | B2 | 1/2010 | Kawai |
| 7,702,240 | B2 | 4/2010 | Minato |
| 7,764,720 | B1 | 7/2010 | Bronder et al. |
| 7,953,129 | B2 | 5/2011 | Kawai |
| 8,023,538 | B2 | 9/2011 | Marcinkevicius et al. |
| 8,049,966 | B2 | 11/2011 | Chann et al. |
| 8,125,704 | B2 | 2/2012 | Mielke et al. |
| 8,179,594 | B1 | 5/2012 | Tidwell et al. |
| 8,184,361 | B2 | 5/2012 | Rothenberg et al. |
| 8,184,363 | B2 | 5/2012 | Rothenberg |
| 8,200,047 | B1 | 6/2012 | Kowalczyk |
| 8,531,761 | B2 | 9/2013 | Chann et al. |
| 8,531,772 | B2 | 9/2013 | Chann et al. |
| 8,614,853 | B2 * | 12/2013 | Chann ............... G02B 27/0944 359/618 |
| 2001/0017720 | A1 | 8/2001 | Hait |
| 2001/0017721 | A1 | 8/2001 | Hait |
| 2002/0126346 | A1 | 9/2002 | Suzuki et al. |
| 2003/0095737 | A1 | 5/2003 | Welch et al. |
| 2003/0219205 | A1 | 11/2003 | Volodin et al. |
| 2004/0052278 | A1 | 3/2004 | Kane et al. |
| 2004/0057475 | A1 | 3/2004 | Frankel et al. |
| 2004/0095983 | A1 | 5/2004 | Whitley |
| 2005/0002424 | A1 | 1/2005 | Bernasconi et al. |
| 2006/0120418 | A1 | 6/2006 | Harter et al. |
| 2006/0153254 | A1 | 7/2006 | Franjic et al. |
| 2006/0171428 | A1 | 8/2006 | Volodin |
| 2006/0257150 | A1 | 11/2006 | Tsuchiya et al. |
| 2006/0291862 | A1 | 12/2006 | Kawai |
| 2007/0047608 | A1 | 3/2007 | Volodin et al. |
| 2007/0078449 | A1 | 4/2007 | Hayashi et al. |
| 2007/0086010 | A1 | 4/2007 | Rothenberg |
| 2007/0165624 | A1 | 7/2007 | Saito et al. |
| 2007/0201795 | A1 | 8/2007 | Rice et al. |
| 2007/0280325 | A1 | 12/2007 | Wang |
| 2008/0084598 | A1 | 4/2008 | Rothenberg et al. |
| 2008/0084605 | A1 | 4/2008 | Rothenberg et al. |
| 2008/0085128 | A1 | 4/2008 | Rothenberg et al. |
| 2008/0089698 | A1 | 4/2008 | Jiang et al. |
| 2009/0201575 | A1 | 8/2009 | Fermann et al. |
| 2010/0073658 | A1 | 3/2010 | Kawai |
| 2010/0110556 | A1 | 5/2010 | Chann et al. |
| 2011/0032602 | A1 | 2/2011 | Rothenberg |
| 2011/0032603 | A1 | 2/2011 | Rothenberg |
| 2011/0032604 | A1 | 2/2011 | Rothenberg et al. |
| 2011/0147566 | A1 | 6/2011 | Furuya et al. |
| 2011/0222574 | A1 | 9/2011 | Chann et al. |
| 2011/0280581 | A1 | 11/2011 | Chann et al. |
| 2011/0292498 | A1 | 12/2011 | Chann et al. |
| 2011/0305250 | A1 | 12/2011 | Chann et al. |
| 2012/0014397 | A1 | 1/2012 | Chann et al. |
| 2012/0188626 | A1 | 7/2012 | Rothenberg et al. |
| 2012/0200439 | A1 | 8/2012 | Hartl et al. |
| 2012/0212801 | A1 | 8/2012 | Rothenberg |
| 2012/0212802 | A1 | 8/2012 | Rothenberg et al. |
| 2012/0219021 | A1 | 8/2012 | Lippey et al. |
| 2013/0063808 | A1 | 3/2013 | Rothenberg |

FOREIGN PATENT DOCUMENTS

| | | |
|---|---|---|
| JP | 2007165624 A | 6/2007 |
| WO | 02071119 A1 | 9/2002 |
| WO | 2006012463 A2 | 2/2006 |
| WO | 2006097531 A1 | 9/2006 |
| WO | 2006012463 A3 | 11/2007 |
| WO | 2008127451 A2 | 10/2008 |
| WO | 2011109753 A1 | 9/2011 |

OTHER PUBLICATIONS

Bates, Harry et al., "Picosecond Pulse Stacking in Calcite," Applied optics vol. 18, No. 7, Apr. 1, 1979.
Chann, B. et al, "Frequency Narrowed External Cavity Diode Laser Array Bar," Optics Letters, vol. 25, No. 18, Sep. 15, 2000.

(56) References Cited

OTHER PUBLICATIONS

Clarkson, W. A., et al., "Two-Mirror Beam-Shaping Technique for High-Power Diode Bars," Optics Letters, vol. 21, No. 6, Mar. 15, 1996.
Dawson, Jay W. et al, "Analysis of the Scalability of Difraction-Limited Fiber Lasers and Amplifiers to High Average Power," Optics Express, vol. 16, No. 17, Aug. 18, 2008.
Fan, T. Y., "Laser Beam Combining for Hihg-Power, High-Radiance Sources," IEEE Journal of Selected Topics in Quantum Electronics, vol. 11, No. 3, May/Jun. 2005.
Gopinath, J. T. et al., "1450nm High Brightness Wavelength Beam Combined Diode Laser Array," Optics Express, vol. 16, No. 13, Jun. 23, 2008.
Loftus, Thomsa H. et al, "Spectrally Beam-Combined Fiber Lasers for High-Average-Power Applications," IEEE Journal of Selected Topics in Quantum Electronics, vol. 13, No. 3, May/Jun. 2007.
Zhou, Shain et al., "Divided-Pulse Amplification of Ultrashort Pulses," Optics Letters, vol. 32, No. 7, Apr. 1, 2007.
Zhu, H, et al., "Sepctrally Narrowed External-Cavity High-Power Stack of Laser Diode Arrays," Optics Letters, vol. 30, No. 11, Jun. 1, 2005.

\* cited by examiner

TWO-DIMENSIONAL WAVELENGTH-BEAM-COMBINING OF LASERS USING FIRST-ORDER GRATING STACK

CROSS-REFERENCE TO RELATED APPLICATIONS

This application is a continuation of and claims priority under 35 U.S.C. §120 to co-pending U.S. application Ser. No. 12/720,186 titled "TWO-DIMENSIONAL WAVELENGTH-BEAM-COMBINING OF LASERS USING FIRST-ORDER GRATING STACK" and filed on Mar. 9, 2010, which is herein incorporated by reference in its entirety for all purposes.

FEDERALLY SPONSORED RESEARCH

This invention was made with government support under Grant No FA8721-05-C-0002 awarded by the United States Air Force. The government has certain rights in this invention.

BACKGROUND

Field of Invention

The present invention relates generally to the field of lasers and, more particularly, to methods and apparatus for wavelength beam combining using laser arrays.

Discussion of Related Art

High-efficiency multi-wavelength external-cavity laser sources that use laser arrays are utilized for a variety of applications including machining, material processing, laser pumping and numerous medical procedures. Two-dimensional (2-D) wavelength-beam-combining (WBC) of laser sources has been as a technique to enhance the power and brightness of 2-D laser sources.

A two-dimensional wavelength beam combining system generally comprises a plurality of multi-wavelength laser elements and two-dimensional dispersive elements. The two-dimensional dispersive elements generally include a diffraction grating/prism and an Echelle grating operating in high diffracting orders. One example of a two-dimensional wavelength beam combining system including the use of high-order gratings is disclosed in U.S. Pat. No. 6,327,292 to Sanchez-Rubio et al. filed on Jun. 21, 1999.

SUMMARY OF INVENTION

Aspects and embodiments are directed to a method and apparatus for two-dimensional wavelength beam combining in which a first-order grating stack is used instead of an Echelle grating. In particular, aspects and embodiments relate to methods and apparatus for generating high-power, high-brightness, multi-wavelength laser sources using two-dimensional laser arrays by wavelength beam combining. According to one aspect, since all the gratings in the system may be first order gratings, embodiments of the system may have high wavelength beam combining efficiency, as discussed further below.

According to one embodiment, a multi-wavelength laser comprises an array of laser emitters arranged in a two-dimensional pattern, each laser emitter producing an optical beam having a wavelength, a grating stack comprising a plurality of first-order diffraction gratings arranged linearly in a first dimension, and a dispersive element. The multi-wavelength laser further comprises a cylindrical telescope positioned between the grating stack and the array of laser emitters and configured to image the optical beams from the array of laser emitters onto the grating stack, a first cylindrical transform lens positioned approximately a focal length from the array of laser emitters and configured to spatially overlap the optical beams in a second dimension forming a first region of overlap at the grating stack, and a second cylindrical transform lens positioned between the dispersive element and the grating stack and configured to receive the optical beams from the grating stack and to spatially overlap the optical beams in the first dimension forming a second region of overlap at the dispersive element, wherein the dispersive element transmits a multi-wavelength output beam comprising the spatially overlapped optical beams from the array of laser emitters.

In one example, the dispersive element is a first-order diffraction grating. In another example, the dispersive element is a prism. In one example, the first dimension is substantially perpendicular to the second dimension. In another example, the cylindrical telescope comprises a first lens element and a second lens element, and the first cylindrical transform lens is positioned between the first lens element and the second lens element. In one example, each of the first-order diffraction gratings of the grating stack has a unique groove density. In another example, the first-order diffraction gratings of the grating stack are arranged so that an angle of incidence of the optical beams on each of first-order diffraction grating of the plurality of first-order diffraction gratings is unique. In another example, the array of laser emitters comprises a plurality of laser emitters arranged in first number of rows, and the grating stack comprises the first number of first-order diffraction gratings. In another example, each of the first-order diffraction gratings is constructed and arranged to transmit a beam comprising spatially overlapped optical beams from one row of laser emitters.

Another embodiment is directed to a method of two-dimensional wavelength beam combining in a laser system. The method comprises acts of spatially overlapping in a first dimension, optical beams from a plurality of laser emitters using a grating stack comprising a plurality of first-order diffraction gratings, imaging the optical beams onto the grating stack, and spatially overlapping in a second dimension the optical beams from the grating stack to generate a multi-wavelength output beam.

In one example of the method, imaging the optical beams onto the grating stack includes imaging the optical beams with a cylindrical telescope positioned between the grating stack and the plurality of laser emitters. In another example, spatially overlapping in the second dimension the optical beams from the plurality of laser emitters includes spatially overlapping the optical beams in the second dimension using a first cylindrical transform lens to form a first region of overlap at the grating stack. The method may further comprise an act of transmitting the multi-wavelength output beam with a dispersive element. In one example, spatially overlapping in the second dimension the optical beams from the grating stack includes spatially overlapping the optical beams in the second dimension using a second cylindrical transform lens to form a second region of overlap at the dispersive element.

According to another embodiment, a multi-wavelength laser comprises a master oscillator configured to generate a first plurality of optical beams, an amplifier array optically coupled to the master oscillator and comprising a plurality of laser elements arranged in a two dimensional array, the amplifier array configured to produce a second plurality of optical beams arranged in a two dimensional array having a first dimension and an orthogonal second dimension, a grating stack comprising a plurality of first-order diffraction gratings arranged linearly in the first dimension, and a dispersive element. The multi-wavelength laser further comprises a cylindrical telescope positioned between the grating stack and the amplifier array and configured to image the second plurality of optical beams from the amplifier array onto the grating stack, a first cylindrical transform lens optically coupled to the amplifier array and configured to spatially overlap the second plurality of optical beams in a second dimension creating a first plurality of overlapped optical beams and forming a first region of overlap at the grating stack, and a second cylindrical transform lens positioned between the dispersive element and the grating stack and configured to receive the first plurality of overlapped optical beams from the grating stack and to spatially overlap the first plurality of overlapped optical beams in the first dimension forming a second region of overlap at the dispersive element, wherein the dispersive element transmits a multi-wavelength output beam comprising the spatially overlapped first plurality of overlapped optical beams.

In one example, the first cylindrical transform lens is positioned approximately a focal length from the amplifier array. In another example, the master oscillator is configured to seed the amplifier array. The dispersive element may be, for example, one of a first-order diffraction grating and a prism. In one example, each of the first-order diffraction gratings of the grating stack has a unique groove density. In another example, the first-order diffraction gratings of the grating stack are arranged so that an angle of incidence of the second plurality of optical beams on each of first-order diffraction grating of the plurality of first-order diffraction gratings is unique.

Still other aspects, embodiments, and advantages of these exemplary aspects and embodiments, are discussed in detail below. Any embodiment disclosed herein may be combined with any other embodiment in any manner consistent with at least one of the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the invention. In the figures:

DETAILED DESCRIPTION

Figure 1:
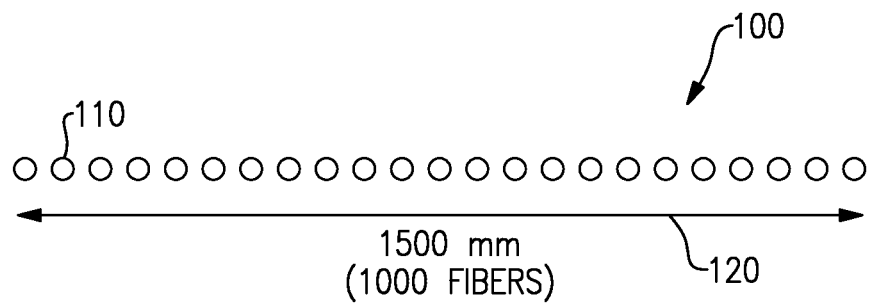
FIG. 1 is a schematic diagram of one example of a one-dimensional array of optical elements.

Aspects and embodiments are directed to a two-dimensional (2-D) wavelength-beam-combining (WBC) implementation including 2-D laser sources and using first-order grating stacks as a technique to enhance the power and brightness. As discussed above, conventional two-dimensional wavelength beam combining systems rely on 2-D dispersive elements, typically including a diffraction grating/prism and an Echelle grating, operating in high diffracting orders. By contrast, embodiments include an implementation in which the 2-D dispersive elements comprise a first-order diffraction grating/prism and a stack of first-order gratings with selected groove densities and/or incidence angles, as discussed further below. Since the gratings may all be operating in the first order, the system may have a higher beam combining efficiency and smaller size than systems which use an Echelle grating operating in very high diffracting orders. Furthermore, first-order diffraction gratings that can handle high power are much more readily available.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Furthermore, although the following discussion may refer primarily to fiber lasers as an example, the aspects and embodiments discussed herein are applicable to any type of laser that is wavelength-selectable, including, but not limited to, semiconductor lasers, diode lasers and fiber lasers.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

In practice, there are limits to the number of elements that can be wavelength-beam-combined in a wavelength beam combining system including, for example, the gain-bandwidth of the laser elements to be combined and practical limits imposed by size of the system. For a one-dimensional wavelength beam combining cavity, to a first order approximation, the size of the system is proportional to the number of laser elements used. As a result, for large numbers of elements, practical limits to the size of the system may present an issue, particularly for systems including fiber lasers/amplifiers in which it may be more difficult to densely pack many elements per unit length as compared with systems using diode lasers.

Figure 2:
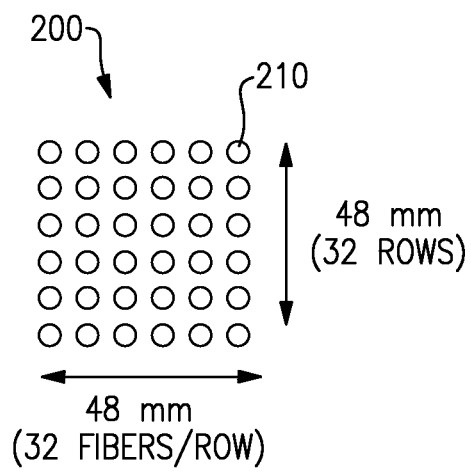
FIG. 2 is a schematic diagram of one example of a two-dimensional array of optical elements.

Referring to FIG. 1, there is illustrated a schematic diagram of a one-dimensional linear laser array 100 comprising a plurality of fiber laser/amplifier elements 110. Assuming a 1.5 millimeter (mm) pitch between the fiber laser elements 110, the linear dimension 120 of the fiber laser array 100, for a one dimensional wavelength beam combining system, is 1.5 meters (m) for 1000 elements. Thus, the size of the transform optics in such a system would be at least 1.5 meters. Fabrication of such large optics with low aberrations is expensive and difficult. The size of the optics can be dramatically reduced if a two-dimensional wavelength beam combining cavity is used instead of a one-dimensional wavelength beam combining cavity. In general, the size of a two-dimensional wavelength beam combining system is proportional to $N^{1/2}$, where N is the number of laser elements. Referring to FIG. 2, there is illustrated a schematic diagram of a two-dimensional linear laser array 200 comprising a plurality of fiber laser elements 210. Assuming again a 1.5 mm pitch between elements, an approximate equivalent to the cavity of the 1000-fiber laser one-dimensional system may become roughly a two-dimensional array of 32×32 elements (a total of 1024 elements) or 48 mm by 48 mm. Thus, the size of the transform optics for the two-dimensional cavity may be on the order of about 5 centimeters (cm) compared to 1.5 m or larger for the one-dimensional cavity. Thus, two-dimensional wavelength beam combining may provide significant size and cost advantages. However, conventional two-dimensional wavelength beam combining systems that use high-order echelle gratings may suffer from reduced efficiency. Furthermore, since echelle-based two-dimensional wavelength beam combining systems use multiple diffraction orders, there is significant unused frequency/wavelengths, which may be inefficient and/or undesirable and also increases the size of the system. In addition, for high power applications first-order gratings that can handle high power are well developed and are readily available, providing cost and practicality benefits over systems using echelle gratings.

Figure 3:
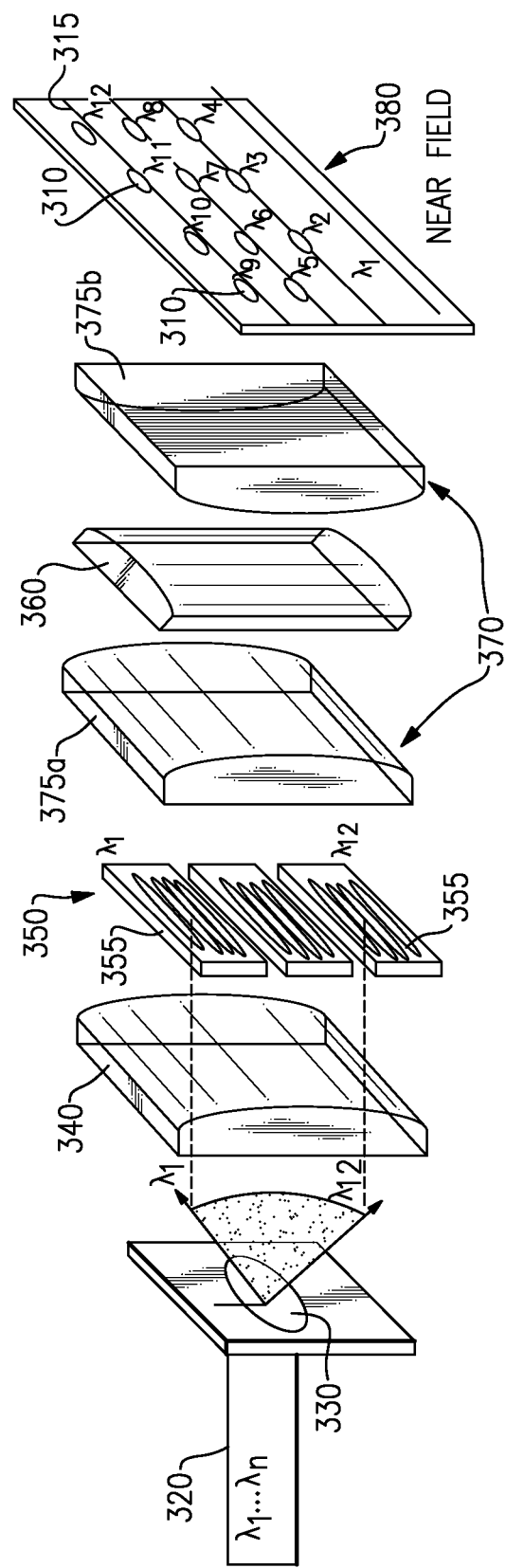
FIG. 3 is a schematic diagram of one example of two-dimensional wavelength beam combining system in an open-loop configuration according to aspects of the invention.

Referring to FIG. 3, there is illustrated one example of a two-dimensional multi-wavelength optical system according to one embodiment in an open-loop configuration. The system 300 comprises a plurality of optical gain media 310, also referred to as laser elements 310, each of which emits a beam of optical radiation at a unique wavelength. In the open-loop configuration, the laser elements emit at a predetermined wavelength, and may be self wavelength-stabilized using an internal grating, external volume Bragg grating or amplifier seeded by a master oscillator (not shown). The optical gain media 310 are positioned in plurality of rows and may be positioned on equal or unequal center-to-center spacing. It is to be appreciated that the row(s) may or may not be straight, depending on the optical system. The optical gain media may include, for example, a plurality of discrete single-mode or multi-mode semiconductor amplifiers or a plurality of fiber amplifiers, and may preferably have sufficient gain and sufficient gain bandwidth to overcome optical losses at the desired lasing wavelengths.

In one example, each of the laser elements 310 in the two-dimensional wavelength beam combining cavity has a unique wavelength. As a result, the two-dimensional wavelength beam combining system comprises optics that spectrally disperses light in two orthogonal dimensions. For ease of explanation of the optics of the two-dimensional wavelength beam, the following discussion assumes a multi-wavelength beam 320 propagating from the left (in reverse), as shown in FIG. 3. The multi-wavelength beam 320 is dispersed into its spectral components along the vertical dimension by a first dispersive element 330. The first dispersive element 330 may be, for example, a first-order diffraction grating or a prism. In one example, the first grating 330 is a slow-dispersion grating with dispersion in the vertical plane in FIG. 3. A cylindrical transform lens 340 maps each spectral component onto a grating stack 350 at its Fourier (focal) plane. In one example, the dispersion of the grating stack 350 is orthogonal to that of the first grating 330. In one example, the grating stack 350 comprises a plurality of fast-dispersion gratings 355, with dispersion in the horizontal direction, as discussed further below. Along the dispersion axis of the grating stack 350, each spectral component diffracts at a certain angle in the horizontal plane in FIG. 3, as discussed further below. In the horizontal plane, a second cylindrical transform lens 360 brings each spectral component to a focus at its Fourier plane. In the vertical dimension, a cylindrical telescope 370 re-images the beams on the grating stack 350 onto the Fourier plane of the second cylindrical transform lens 360. Thus, each spectral component of the multi-wavelength beam 320 comes to a focus at the Fourier plane in both the horizontal and vertical dimensions. As the wavelength is changed, the focus describes a line 315 in the Fourier plane (image plane 380), as shown in FIG. 3.

According to one embodiment, in order to map the entire spectral content in multiple lines 315, as shown by the "raster scan" pattern on the image plane 380 in FIG. 3, the grating stack 350 comprises multiple individual first-order gratings 355, each grating 355 responsible for generating one of the lines 315 in the image plane 380. For example, assume the multi-wavelength beam 320 comprises 12 unique wavelengths, $\lambda_1$ through $\lambda_{12}$, and assume that these 12 wavelengths are to be partitioned into 3 rows, as illustrated in FIG. 3. In this example, the grating stack 350 comprises three individual high dispersion gratings 355 stacked in the vertical dimension, as shown and discussed further below.

Figure 4:
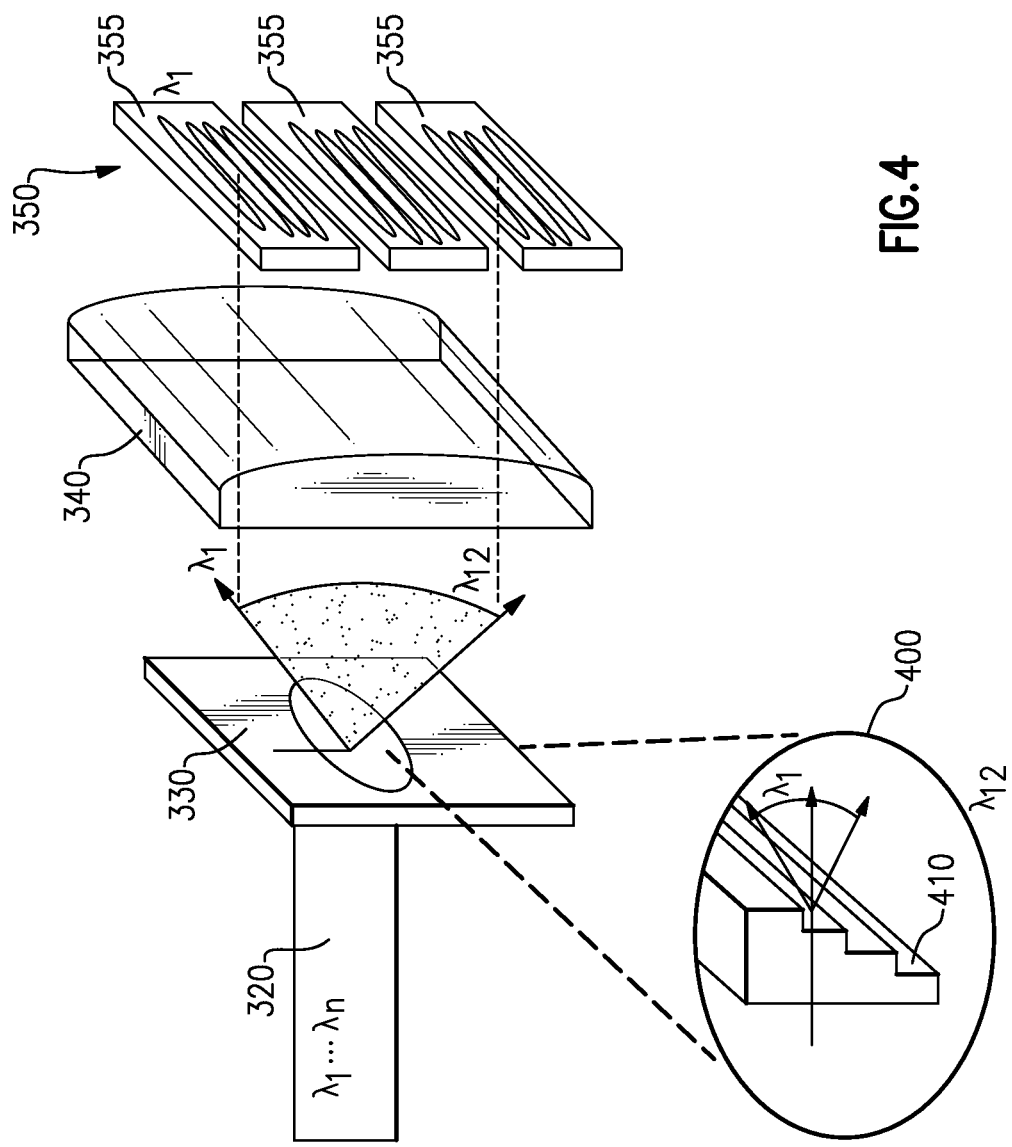
FIG. 4 is an enlarged view of an example of a grating which may be used in the system of FIG. 3.

Referring to FIG. 4, there is illustrated an enlarged view of a portion 400 of the first grating 330. As discussed above, the first (slow) grating 330 may disperse the 12 wavelengths into the spectral components along the vertical dimension. As illustrated in FIG. 4, the grating 330 comprises a plurality of grooves 410 arranged in the vertical dimension to disperse the multi-wavelength beam 320 into the 12 individual wavelengths. As discussed above, the cylindrical transform lens 340 images the 12 wavelengths along the vertical dimension onto the grating stack 350, as shown in FIG. 3.

Figure 5:
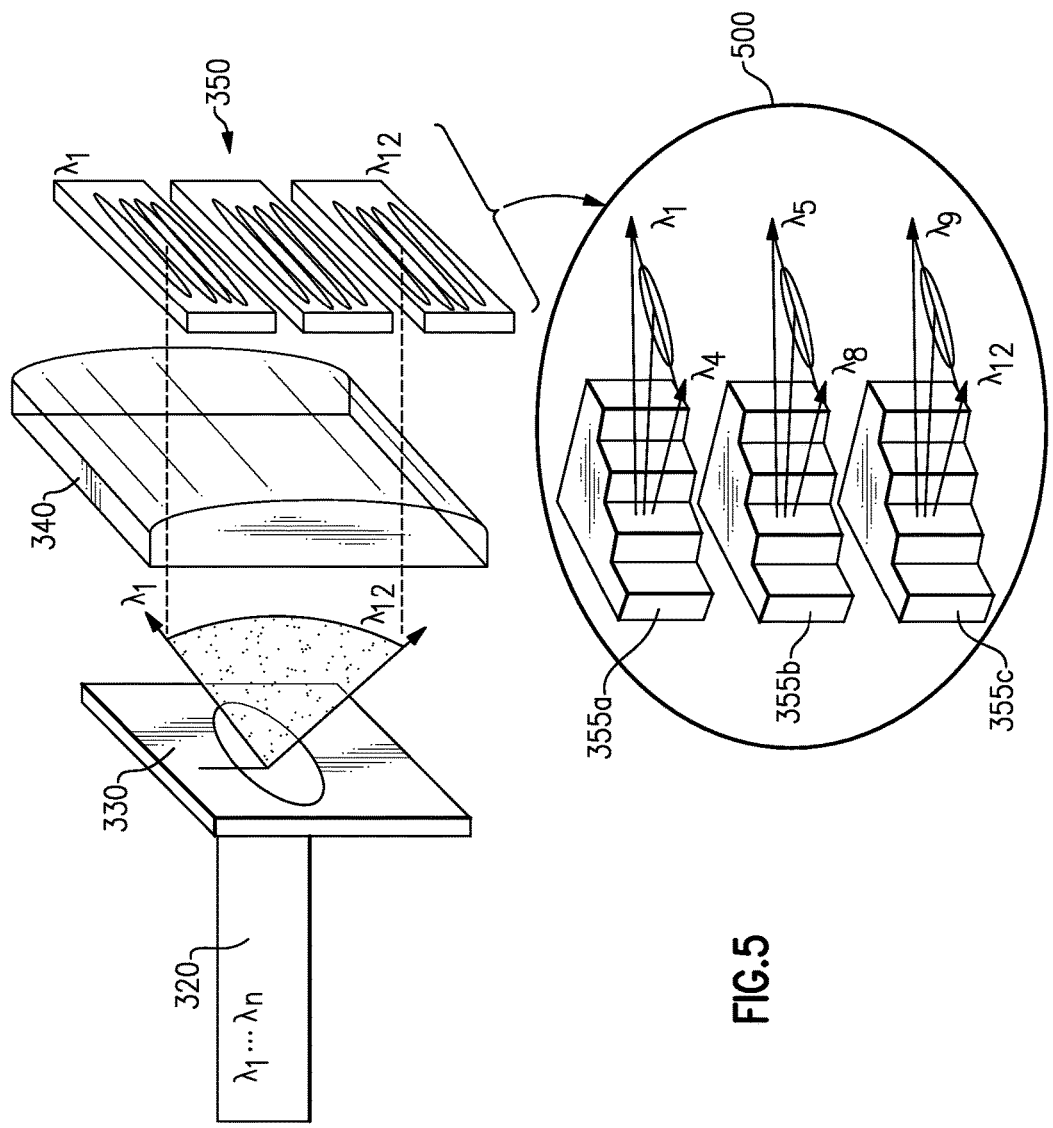
FIG. 5 is an enlarged view of an example of a grating stack which may be used in the system of FIG. 3.

Referring to FIG. 5, there is illustrated an enlarged view 500 of one example of the grating stack 350. In one example, each individual first-order grating 355 of the grating stack 350 intercepts 4 of the 12 wavelengths. Each individual grating 355 comprises a plurality of grooves to disperse the wavelengths in the horizontal dimension, as shown in FIG. 5. Thus, the top grating 355a of the grating stack 350 may disperse wavelengths $\lambda_1$-$\lambda_4$ along the horizontal dimension. Wavelength $\lambda_5$ may be on the second grating 355b of the grating stack 350. If the second grating 355b has the same groove density and angle of incidence as the top grating 355a, then $\lambda_5$ will disperse along the same line 315 (see FIG. 3) as the wavelengths $\lambda_1$-$\lambda_4$. However, in one example, the system is configured to make $\lambda_5$ the first wavelength of a new row in the image plane 380. This may be achieved in several different ways. For example, assuming that the second grating 355b has the same groove density as the top grating 355a, the second grating 355b may be slightly rotated such that the diffracted angle of $\lambda_5$ is the same as that of wavelength $\lambda_1$. As a result, $\lambda_5$ may be imaged onto the image plane 380 beneath $\lambda_1$, as shown in FIG. 3. Alternatively, the angle of incidence and diffraction on second grating 355b may be the same as for the top grating 355a, but the groove density may be made slightly different. Similarly, the same principles can be applied to the bottom grating 355c relative to the top and middle gratings 355a and 355b. Thus, N discrete wavelengths are mapped to a two-dimensional pattern of beams in the image plane 380, as shown in FIG. 3. To operate as a two-dimensional wavelength beam combining laser system, the system 300 uses the above-discussed optics and principles in reverse.

Figure 6:
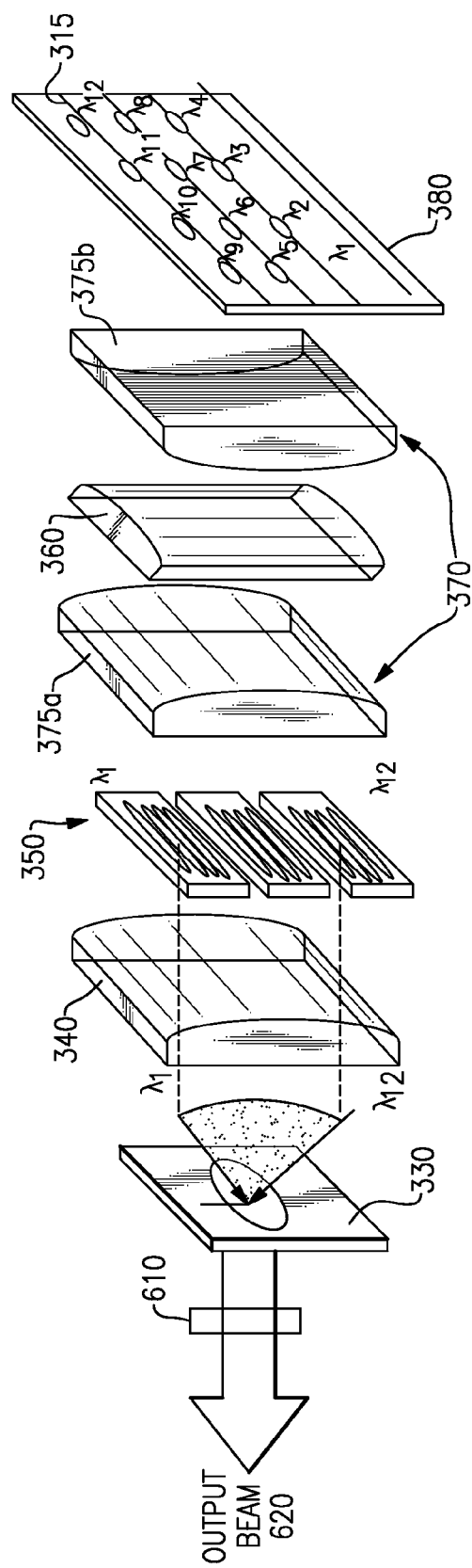
FIG. 6 is a schematic diagram of an example of a two-dimensional wavelength beam combining system in a closed-loop configuration according to aspects of the invention.

Referring to FIG. 6, there is illustrated an example of a two-dimensional wavelength beam combining system in a closed-loop configuration. In the example of FIG. 6, the wavelength of each laser element 310 is stabilized by a partially reflecting mirror 610.

Figure 7:
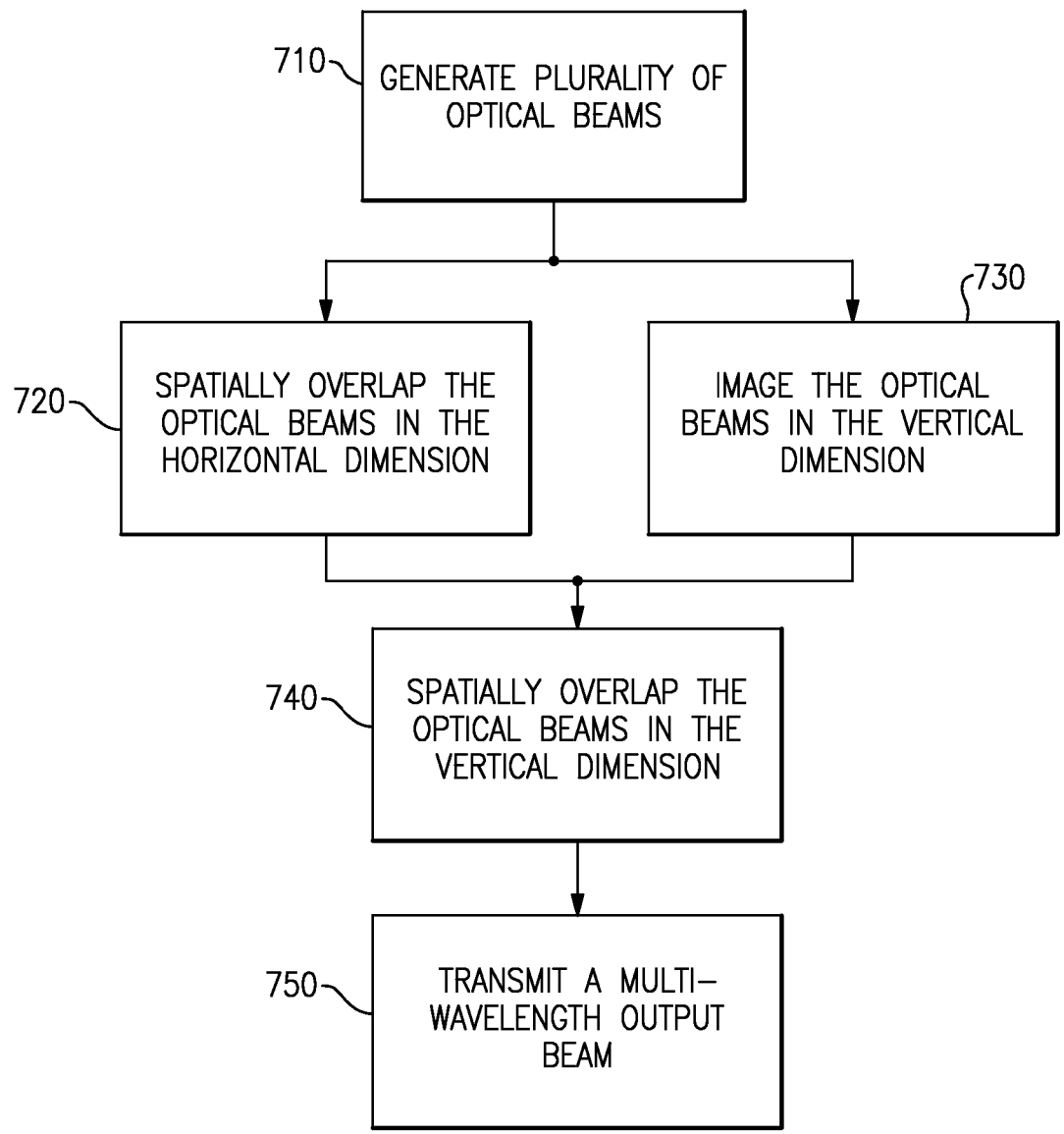
FIG. 7 is a flow diagram of one example of a method of two-dimensional wavelength beam combining according to aspects of the invention.

FIG. 7 illustrates a flow diagram of one example of a method of two-dimensional wavelength beam combining using the system shown in either FIG. 3 or FIG. 6. Referring to FIGS. 3 and 6, an array of laser elements 310, for example, fiber laser elements, is positioned such that the fibers have their end-facets at the image plane 380. Each fiber 310 generates a beam at a specified wavelength and in the appropriate location in the array. Thus, the two-dimensional pattern (array) of beams is generated by the plurality of fibers 310. For example, an array of 12 fibers, positioned in three rows 315 of four elements per row, may generate an array of beams with 12 discrete wavelengths, $\lambda_1$-$\lambda_{12}$. Accordingly, in FIG. 7, step 710 comprises generating a plurality of beams, each with a particular wavelength, using a corresponding plurality of laser elements 310, as discussed above.

As shown in FIGS. 3 and 6, the two-dimensional wavelength beam combining system may comprise a cylindrical transform lens 360, which may be positioned a focal length from the image plane 380. The beams from the array of laser elements 310 may be spatially combined in the horizontal dimension by the cylindrical transform lens 360, with the region of overlap formed at the surface of the grating stack 355. Each of the first order gratings 355 in the grating stack 350 spectrally combines the beams from a row of emitters 310, in the reverse of the operation discussed above. Thus, referring again to FIG. 7, step 720 may include spatially overlapping the beams in the horizontal dimension. In step 730, the optical beams may be imaged onto the grating stack 355 in the vertical dimension using the cylindrical telescope 370. As shown in FIGS. 3 and 6, in one example, the cylindrical telescope 370 comprises two elements, 375a and 375b positioned on either side of the cylindrical transform lens 360. The cylindrical telescope 370 collimates the optical beams from the emitters 310 to reduce optical losses caused by divergence in the optical beams produced by the emitters 310. It is to be appreciated that steps 720 and 730 may occur substantially simultaneously, rather than sequentially.

According to one embodiment, from the grating stack 355, the optical beams (or at least the portion of the light therefrom) are transmitted to the other cylindrical transform lens 340. The cylindrical transform lens 340 is operative in the vertical dimension to spatially overlap the beams (spectral components) with the region of overlap forming at the grating 330, as shown in FIG. 6. Thus, referring again to FIG. 7, step 740 may include spatially overlapping the beams in the vertical dimension. The grating 330 acting in transmission provides the multi-wavelength beam to a partially reflecting output coupler 610. A portion of the laser light from each laser element 310 is reflected off the partially reflecting output coupler 610 to stabilize each laser element to a unique wavelength. The remaining light is transmitted as the multi-wavelength output beam 620 (step 750) and may provide usable output power.

Figure 8:
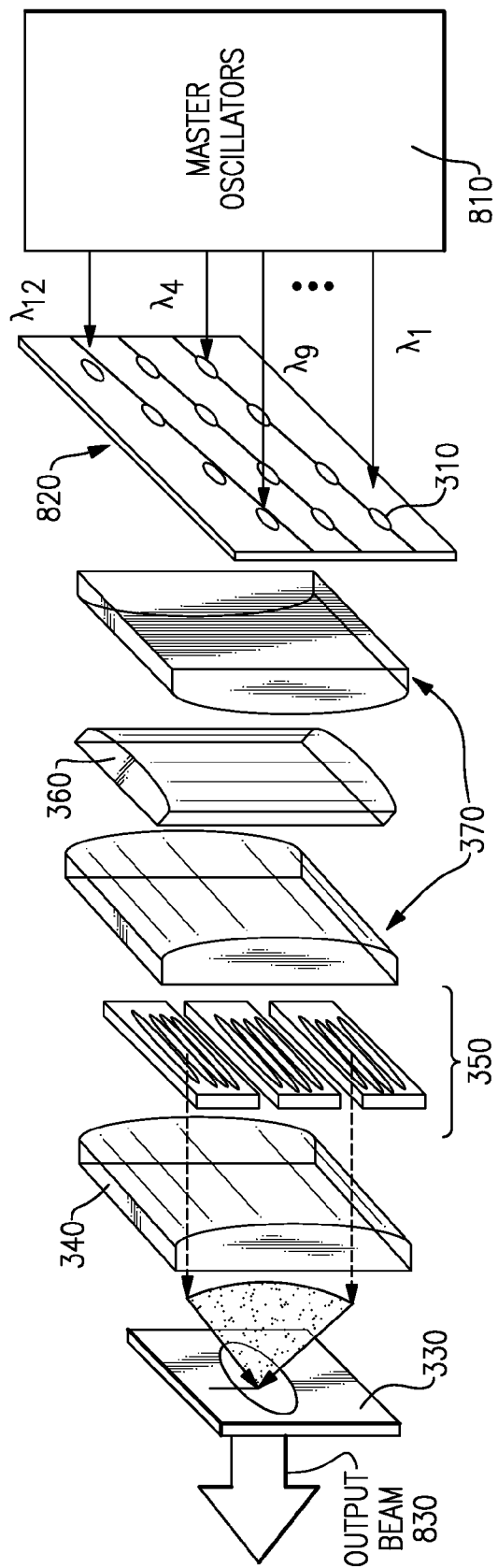
FIG. 8 is a schematic diagram of an example of a master-oscillator power amplifier implementation using a two-dimensional wavelength beam combining system according to aspects of the invention.
Figure 9:
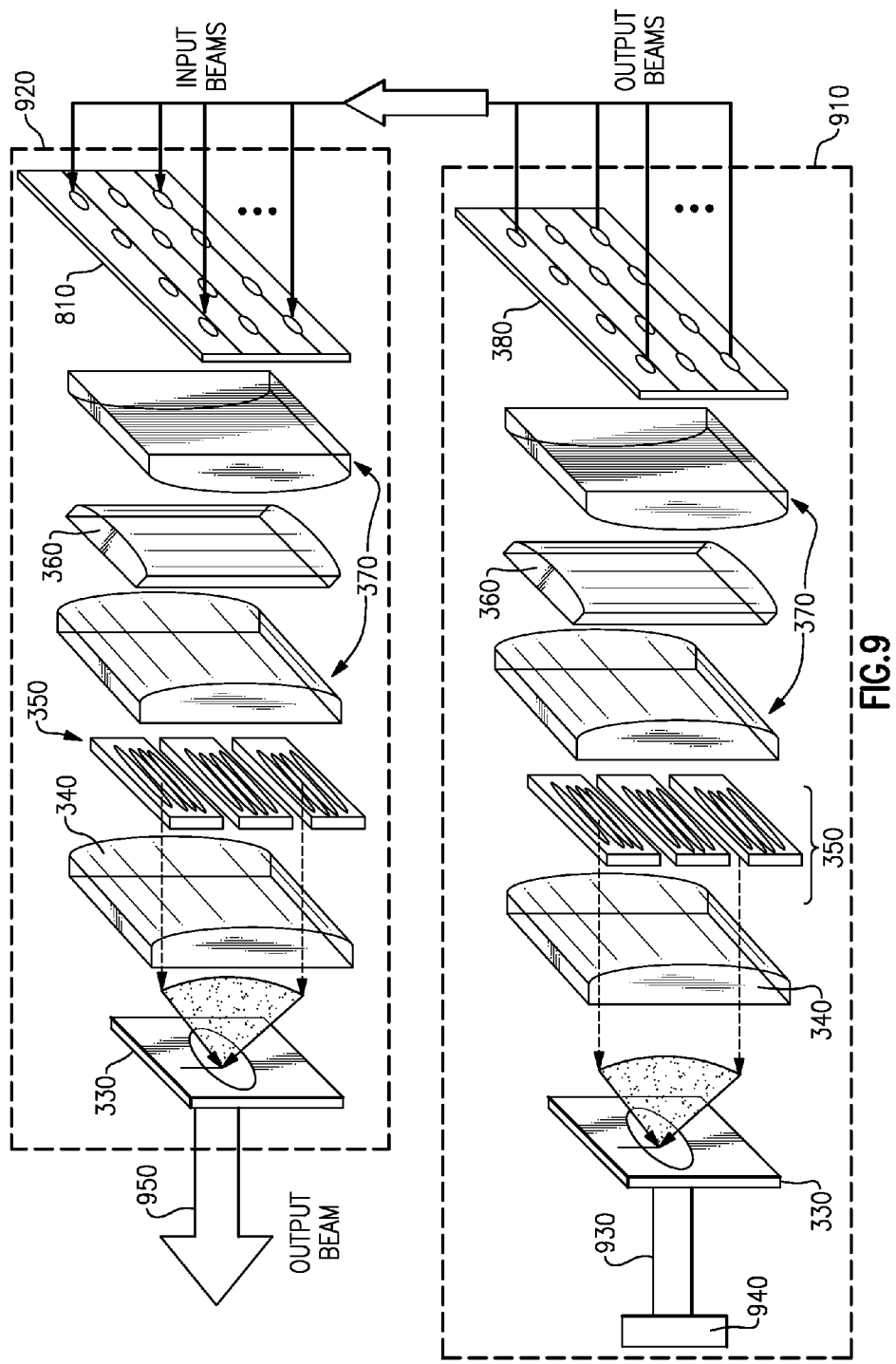
FIG. 9 is a schematic diagram of an example of a master-oscillator power amplifier implementation according to aspects of the invention.

Referring to FIG. 8, there is illustrated an example of a master-oscillator power amplifier implementation using a two-dimensional wavelength beam combining system according to one embodiment. The system include a master oscillator 810 which may comprise N laser elements (with N being an integer greater than or equal to one) each generating a unique wavelength $\lambda_n$. The N laser elements of the master oscillator 810 may be discrete elements, or elements arranged in bars and/or arrays, etc. or any form, provided only that the elements generate the desired wavelength(s). The master oscillator seeds a power amplifier implemented using a two-dimensional wavelength beam combining system such as that discussed above with reference to FIGS. 3 and 6. In one example, the wavelengths from the master oscillator 810 are coupled to an amplifier array 820. The master oscillator array 810 comprises a plurality of laser elements (not shown) which each lase at a unique wavelength. The output of the master oscillator array 810 is used to seed the amplifier array 820. As will be appreciated by those skilled in the art, given the benefit of this disclosure, there are many methods for seeding the amplifier array 820, one example of which is illustrated in FIG. 9 discussed below. The beams from the amplifier array 820 are wavelength beam combined, as discussed above, to generate a multi-wavelength output beam 830. Although not illustrated in FIG. 8, the system may include an output coupler 610 as discussed above with reference to FIG. 6.

Another embodiment of a master-oscillator power amplifier implementation is illustrated in FIG. 9. In the example illustrated in FIG. 9, both the master oscillator 910 and the power amplifier 920 are implemented using the wavelength beam combining optics discussed above with reference to FIGS. 3 and 6. A multi-wavelength input beam 930 from a mirror or output coupler 940 propagates through the master oscillator system 910, as discussed above with reference to FIG. 3, and is dispersed into the individual wavelengths $\lambda_1 \ldots \lambda_n$ at the image plane 380. These wavelengths become the wavelengths provided by the master oscillator 910 (or 810 discussed above with reference to FIG. 8). The output beams are coupled, by example, via relay optics (not shown) to the amplifier array 810 in the power amplifier 920, thus becoming input beams to the amplifier. The beams are wavelength beam combined, and amplified, by the power amplifier 920, as discussed above with reference to FIG. 6, and the amplifier 920 produces a multi-wavelength output beam 950. This output beam 950 represents the usable power from the system.

Thus, there has been described a two-dimensional wavelength beam combining implementation of a two-dimensional array of laser sources. The wavelength beam combining may be used as a technique to enhance the power and/or brightness of the laser sources. As discussed above, prior two-dimensional wavelength beam combining systems rely on two-dimensional dispersive elements, such as an Echelle grating, operating in high diffracting orders. By contrast, according to one embodiment, the implementation uses two-dimensional dispersive elements that include a first-order diffraction grating or prism 330, and a stack 350 of first-order gratings 355. As discussed above, each of the first order gratings 355 in the grating stack 350 may have unique groove densities or incidence angles to combine the beams from the different laser elements 310 in the array, without requiring operation in high diffracting orders. As a result of using only first-order diffraction elements, a two-dimensional wavelength beam combining implementation may have higher efficiency and be producible at lower cost than conventional two-dimensional wavelength beam combining cavities.

Any of the above-discussed embodiments of wavelength beam combining laser cavities may be incorporated into an associated laser system. Such a laser system may include, for example, the wavelength beam combining cavity, electrical, thermal, mechanical, electro-optical and opto-mechanical laser control equipment, associated software and/or firmware, and an optical power delivery subsystem. Embodiments of the wavelength beam combining laser cavities, and associated laser systems, can be used in applications that benefit from the high power and brightness of the embodied laser source produced using the wavelength beam combining cavity. These applications may include, for example, materials processing, such as welding, drilling, cutting, annealing and brazing; marking; laser pumping; medical applications; and directed energy applications. In many of these applications, the laser source formed by the wavelength beam combining cavity may be incorporated into a machine tool and/or robot to facilitate performance of the laser application.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A multi-wavelength laser comprising:
    an array of laser emitters arranged in a two-dimensional pattern, each laser emitter producing an optical beam having a wavelength;
    a grating stack comprising a plurality of first-order diffraction gratings arranged linearly in a first dimension;
    a dispersive element;
    a cylindrical telescope positioned between the grating stack and the array of laser emitters and configured to image the optical beams from the array of laser emitters onto the grating stack;
    a first cylindrical transform lens positioned approximately a focal length from the array of laser emitters and configured to spatially overlap the optical beams in a second dimension forming a first region of overlap at the grating stack; and
    a second cylindrical transform lens positioned between the dispersive element and the grating stack and configured to receive the optical beams from the grating stack and to spatially overlap the optical beams in the first dimension forming a second region of overlap at the dispersive element;
    wherein the dispersive element transmits a multi-wavelength output beam comprising the spatially overlapped optical beams from the array of laser emitters.

2. The multi-wavelength laser as claimed in claim 1, wherein the dispersive element is a first-order diffraction grating or a prism.

3. The multi-wavelength laser as claimed in claim 1, wherein the first dimension is substantially perpendicular to the second dimension.

4. The multi-wavelength laser as claimed in claim 1, wherein each of the first-order diffraction gratings of the grating stack has a unique groove density.

5. The multi-wavelength laser as claimed in claim 1, wherein the cylindrical telescope comprises a first lens element and a second lens element; and
    wherein the first cylindrical transform lens is positioned between the first lens element and the second lens element.

6. The multi-wavelength laser as claimed in claim 1, wherein the first-order diffraction gratings of the grating stack are arranged so that an angle of incidence of the optical beams on each of first-order diffraction grating of the plurality of first-order diffraction gratings is unique.

7. The multi-wavelength laser as claimed in claim 1, wherein the array of laser emitters comprises a plurality of laser emitters arranged in first number of rows; and
    wherein the grating stack comprises the first number of first-order diffraction gratings.

8. The multi-wavelength laser as claimed in claim 7, wherein each of the first-order diffraction gratings is constructed and arranged to transmit a beam comprising spatially overlapped optical beams from one row of laser emitters.

9. The multi-wavelength laser as claimed in claim 1, further comprising a partially reflecting output coupler optically coupled to the dispersive element and configured to receive the multi-wavelength output beam, to reflect a portion of multi-wavelength output beam to stabilize each laser emitter to produce the respective optical beam at the respective wavelength, and to transmit a remaining portion of the multi-wavelength output beam.

10. The multi-wavelength laser as claimed in claim 1, wherein the array of laser emitters comprises an array of fiber lasers or an array of semiconductor diode lasers.

\* \* \* \* \*